(12) United States Patent
Chen et al.

(10) Patent No.: US 8,510,940 B2
(45) Date of Patent: Aug. 20, 2013

(54) METHOD OF FABRICATING A MULTI-TRACE VIA SUBSTRATE

(75) Inventors: Min-Yao Chen, Kaohsiung (TW); Mao-Chang Chuang, Kaohsiung (TW); Ming-Chiang Lee, Kaohsiung (TW); Chien-Hao Wang, Hukou Township, Hsinchu County (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 287 days.

(21) Appl. No.: 12/790,417

(22) Filed: May 28, 2010

(65) Prior Publication Data
US 2011/0174529 A1   Jul. 21, 2011

(30) Foreign Application Priority Data
Jan. 21, 2010   (TW) .............................. 99101677 A

(51) Int. Cl.
*H01K 3/10*   (2006.01)
(52) U.S. Cl.
USPC .................. 29/852; 29/825; 29/846; 174/262
(58) Field of Classification Search
USPC ............................ 29/825, 846, 852; 174/262
See application file for complete search history.

(56) References Cited

U.S. PATENT DOCUMENTS

| | | | |
|---|---|---|---|
| 5,916,736 A | 6/1999 | Doi et al. | |
| 6,467,160 B1 * | 10/2002 | Cummings et al. | 29/831 |
| 7,418,780 B2 * | 9/2008 | Lee et al. | 29/852 |
| 7,452,804 B2 * | 11/2008 | Beck et al. | 438/627 |
| 7,516,545 B2 | 4/2009 | Kang et al. | |
| 7,517,798 B2 * | 4/2009 | Tuttle | 438/667 |
| 8,222,537 B2 * | 7/2012 | Dudnikov et al. | 174/262 |
| 2007/0125570 A1 | 6/2007 | Ho | |
| 2009/0122498 A1 | 5/2009 | Lan et al. | |

FOREIGN PATENT DOCUMENTS

TW   200723988 A   6/2007
TW   200922413 A   5/2009

* cited by examiner

*Primary Examiner* — Carl Arbes
(74) *Attorney, Agent, or Firm* — Muncy, Geisler, Olds & Lowe, PLLC

(57) ABSTRACT

A method of fabricating a multi-trace via substrate is disclosed. A substrate at least having a first surface and a hole is provided, wherein the hole has a hole wall. A first conductive layer is formed on the entire surface of the substrate and the hole wall. A photoresist layer applied over the entire surface of the first conductive layer is selectively patterned to define a plurality of laterally separated regions on the first conductive layer. A patterned photoresist layer is used as a mask and a second conductive layer substantially thicker than the first conductive layer is electroplated on the laterally separated regions. The patterned photoresist layer is removed. The portion of the first conductive layer not covered by the second conductive layer is substantially removed to form a plurality of laterally separated traces extended on the first surface and through the hole.

19 Claims, 10 Drawing Sheets

METHOD OF FABRICATING A MULTI-TRACE VIA SUBSTRATE

CROSS-REFERENCES TO RELATED APPLICATIONS

This application claims the benefit of Taiwan application Serial No. 099101677, filed Jan. 21, 2010, the subject matter of which is incorporated herein by reference.

BACKGROUND OF THE INVENTION

1. Field of the Invention

The invention relates in general to a structure having a via and method of fabricating the same, and more particularly to a structure having a multi-trace via substrate and method of fabricating the same.

2. Description of the Related Art

Printed circuit board (PCB or the circuit board) is an indispensible element to consumer electronic products. The circuit design of the PCB arranges the circuits connecting the elements in a pattern, further incorporates the materials and the copper-clad laminate (CCL), and adopts mechanical processing and surface treatment so as to realize an electrical conductor on an insulator. Thus, the parts of the electronic circuits of the PCB are connected so that respective functions are performed smoothly.

As electronic equipment is getting more and more complicated and product size is getting bigger and bigger, more parts are needed, and the densities of the circuits and parts on the PCB are getting higher and higher. By reducing the size of the plated through hole, more number of plated through holes can be disposed in the same area. However, due to the restriction in the manufacturing process, if the plated through hole is too small, the plated through hole will be hard to manufacture and the stability will be deteriorated. Currently, the technology of using one plated through hole for a plurality of traces in the manufacturing process of semiconductor is provided to meet the market needs of small size and multi-function for electronic products. According to the U.S. Pat. No. 6,073,344, laser cutting is performed on the conductive layer, which is besides the via and disposed on the substrate, to form several independent traces interconnecting the circuits on different layers through the same via. However, the formation of circuit pattern on the conductive materials by laser is time-consuming and may easily damage the surface of the dielectric layer/insulating substrate under the conductive material and affect the yield rate of the products.

SUMMARY OF THE INVENTION

The disclosure is directed to a structure having a multi-trace via substrate and method of fabricating the same. According to the method of the disclosure, the multi-trace via substrate is quickly formed and the structure of each layer is complete without damage, so that the yield rate is further increased.

According to a first aspect of the present disclosure, a method of fabricating at least a multi-trace via substrate is disclosed, wherein the method comprises:

Providing a substrate at least having a first surface and a hole, wherein the hole has a hole wall;

Forming a first conductive layer on the entire surface of the substrate and the hole wall;

Applying a photoresist layer over the entire surface of the first conductive layer, and selectively patterning photoresist layer so as to define a plurality of laterally separated regions on the first conductive layer extended from the first surface to the hole wall;

Using the patterned photoresist layer as a mask and electroplating a second conductive layer substantially thicker than the first conductive layer on the laterally separated regions;

Removing the patterned photoresist layer; and

Substantially removing the portion of the first conductive layer not covered by the second conductive layer to form a plurality of laterally separated traces extended on the first surface and through the hole.

According to a second aspect of the present disclosure, a method of fabricating at least a multi-trace via substrate is disclosed, wherein the method comprises:

Providing a substrate having a first surface and a hole, wherein the hole has a hole wall;

Forming a first conductive layer on the first surface of the substrate and the hole wall;

Selectively patterning the first conductive layer inside and around the hole to define a plurality of insulating regions, wherein the insulating regions are formed by removing the first conductive layer, and each insulating region is extended to the hole wall from the first surface of the substrate;

Applying a photoresist layer over the entire surface of the first conductive layer and the insulating regions, wherein the photoresist layer is selectively patterned to define a plurality of first regions on the first conductive layer and expose a second region of the insulating regions, and at least two first regions are connected to the second region;

Using the patterned photoresist layer as a mask and electroplating a second conductive layer on the portion outside the insulating region of the first regions and the second region, wherein the second conductive layer is substantially thicker than the first conductive layer;

Removing the patterned photoresist layer; and

Substantially removing the portion of the first conductive layer not covered by the second conductive layer to form a plurality of laterally separated traces extended on the first surface and through the hole.

According to a third aspect of the present disclosure, a structure having multi-trace via substrate is disclosed. The structure comprises a substrate and a plurality of laterally separated traces. The substrate at least has a first surface and a hole, wherein the hole has a hole wall. The laterally separated traces are extended on the first surface and through the hole, and each of the laterally separated traces includes a patterned first conductive layer and a patterned second conductive layer. The patterned first conductive layer is formed on the first surface and the hole, and the patterned second conductive layer is formed on the patterned first conductive layer. The patterned second conductive layer is thicker than the patterned first conductive layer.

The disclosure will become apparent from the following detailed description of the preferred but non-limiting embodiments. The following description is made with reference to the accompanying drawings.

BRIEF DESCRIPTION OF THE DRAWINGS

FIGS. 8, 9A, 9B, 10-12, 13A, 13B, 13C, 14, 15A, 15B, and 15C depict the process of fabricating a multi-trace via substrate according to a second embodiment of the disclosure.

DETAILED DESCRIPTION OF THE INVENTION

According to the method of fabricating a multi-trace via substrate disclosed in the disclosure, the traces and the via are formed without damaging the electrically insulating material being exposed, and the yield rate of the products is increased consequently. Two embodiments are disclosed below. However, the procedures and details of the formation method and the structure of the embodiments are for exemplification only, not for limiting the scope of protection of the disclosure. Moreover, secondary elements are omitted in the disclosure of the embodiments for highlighting the technical features of the disclosure.

First Embodiment

Figure 1:
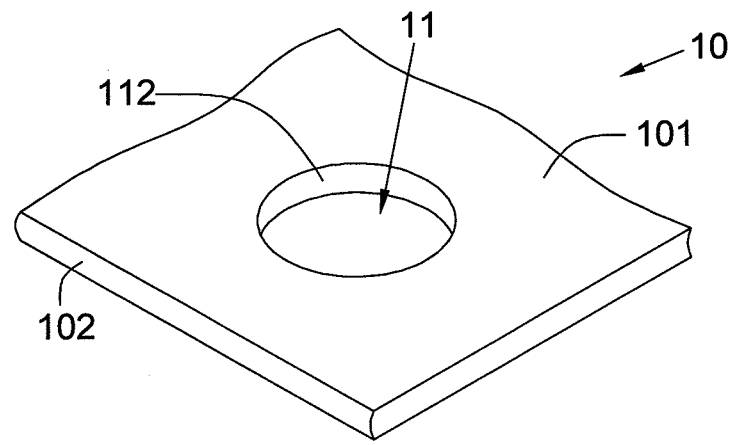
FIGS. 1-3, 4A, 4B, 5, 6A, 6B, 7A, 7B, and 7C depict the process of fabricating a multi-trace via substrate according to a first embodiment of the disclosure.
Figure 2:
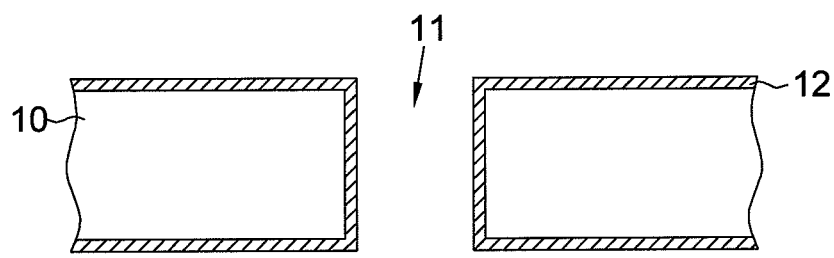

Referring to FIG. 1~FIG. 7C, the process of fabricating a multi-trace via substrate according to a first embodiment of the disclosure is depicted. Firstly, as indicated in FIG. 1, a substrate 10 having a first surface 101, a second surface 102 and a hole 11 is provided, wherein the hole 11 has a hole wall 112, and both the first surface 101 and the hole wall 112 comprise an electrically insulating material (not illustrated). The substrate 10 could be an organic substrate, such as a copper-clad laminate (CCL), wherein a metal layer (such as a pressed copper-clad) is formed on both or either of the top surface and the bottom surface of a dielectric layer. The dielectric layer could be a resin, such as ammonium bifluorideajinomoto build-up film (ABF), bismaleimide triazine (BT), polyimide (PI) resin, liquid crystal polymide (LCP), and epoxy. These resins could be mixed with a glass fiber (such as fiber pad) or a specific fiber to enhance the structural strength of the dielectric layer. Besides, the substrate 10 could be a ceramic substrate or a semiconductor substrate (such as a silicon substrate). Additionally, the hole 11 could be selectively formed by etching, mechanical drilling or laser drilling. If the semiconductor substrate is selected, then the surface (comprising the hole wall surface) of the substrate needs to be covered by a layer of insulating material. Next, as indicated in FIG. 2, a first conductive layer 12 is formed on the first surface 101 of the substrate 10 and the hole wall 112, and is further extended to the second surface 102 along the hole wall 112. In one embodiment, the first conductive layer 12 could be a copper layer formed by an electroless plating method or by sputtering method.

Figure 3:
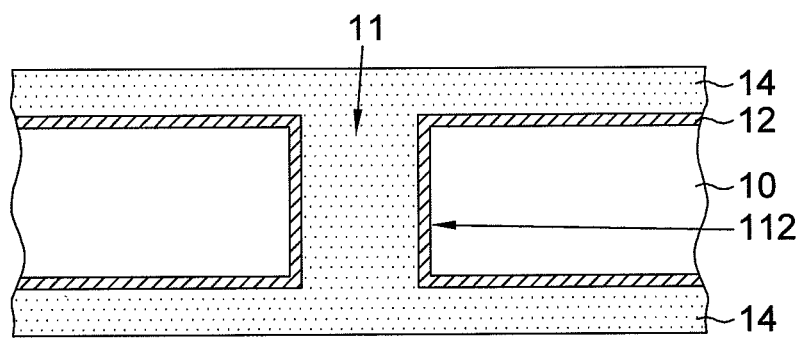

Then, as indicated in FIG. 3, a photoresist layer 14, applied over the entire surface of the first conductive layer 12, comprises at least one of a first surface 101 and a second surface 102, wherein the photoresist layer 14 fills up the hole 11. The photoresist inside the hole 11 is separated by the first conductive layer 12 and the hole wall 112. In an application, a dry film photoresist is pressed on the substrate 10, so that the photoresist fills up the hole 11 to form the photoresist layer 14. In another application, a photoresist solution is spread on the substrate 10 so that the photoresist fills up the hole 11, and the photoresist solution, after having been dried, forms the photoresist layer 14.

It is noted that in practical application, relevant manufacturing processes can be simultaneously or subsequently applied to the first surface 101 and the second surface 102 which are respectively disposed on the top and the bottom of the substrate 10. To clearly elaborate the present embodiment, part of the following drawings illustrates the top view of the first surface 101.

Figure 4A:
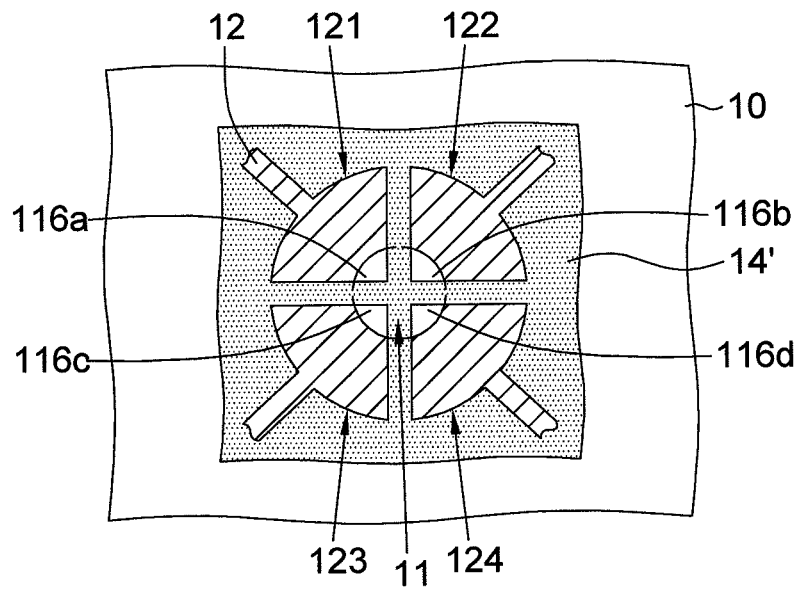

Next, the photoresist layer is selectively patterned to define a plurality of laterally separated regions 121, 122, 123, 124 on the first conductive layer 12 as indicated in FIG. 4A.

Figure 4B:
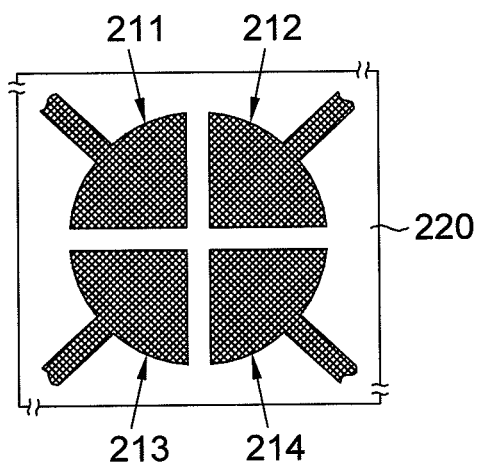

In the first embodiment, the photoresist layer 14 is made from a dry film photoresist, and the mask 20 of FIG. 4B is provided for selectively patterning the dry film photoresist, wherein the mask 20 has a plurality of non-transparent regions 211~214 and at least one transparent region 220, and the locations and the shapes of the non-transparent regions 211~214 correspond to that of the laterally separated regions 121~124 of FIG. 4A. After exposure, the portion of the dry film photoresist corresponding to the transparent region 220 of the mask 20 is radiated by the light and forms a patterned photoresist layer 14' after polymerization. The portion of the dry film photoresist which is not radiated by the light but corresponds to the non-transparent region 211~214 of the mask 20 is removed to expose the first conductive layer 12 disposed on the laterally separated regions 121~124. In one embodiment, the portions of the laterally separated regions 121~124 extended in the hole 11 are substantially parallel to each other and perpendicular to the first surface 101 of the substrate 10. Moreover, due to the existence of the hole 11 which is filled with a dry film photoresist (the photoresist layer 14), the mask 20 of FIG. 4B is used, and the pattern design of the mask 20 enables the dry film photoresist to form a photoresist barrier portion of FIG. 4A in the hole 11 after exposure, wherein the photoresist barrier portion substantially has a cross-shaped cross section. Therefore, the photoresist barrier portion divides the hole 11 into a plurality of isolated spaces 116a, 116b, 116c, 116d, and the laterally separated regions 121~124 are extended to the second surface 102 from the first surface 101 through the isolated spaces 116a~116d inside the hole 11.

Figure 5:
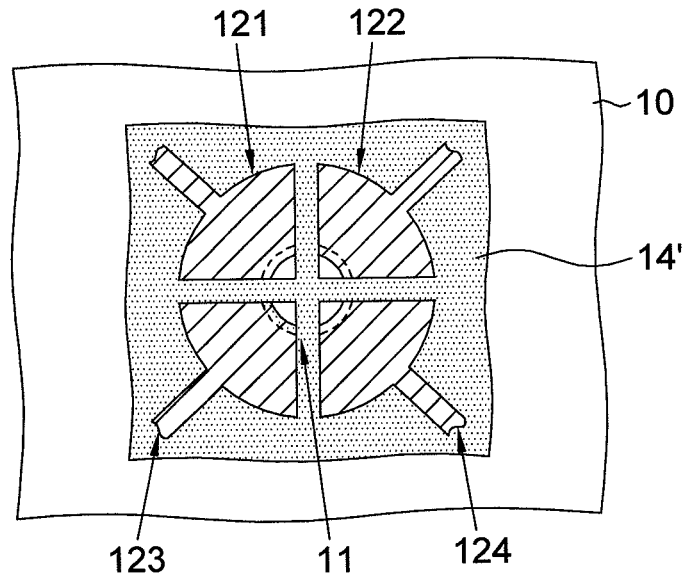

Then, as indicated in FIG. 5, the patterned photoresist layer 14' is used as a mask, and a second conductive layer 16 substantially thicker than the first conductive layer 12 is electroplated on the laterally separated regions 121~124. The second conductive layer 16 is extended to the second surface 102 from the first surface 101 through the isolated spaces 116a~116d formed by the photoresist barrier portion inside the hole 11. In an embodiment, the second conductive layer 16 could be formed by a copper layer or made from other conductive materials.

Figure 6A:
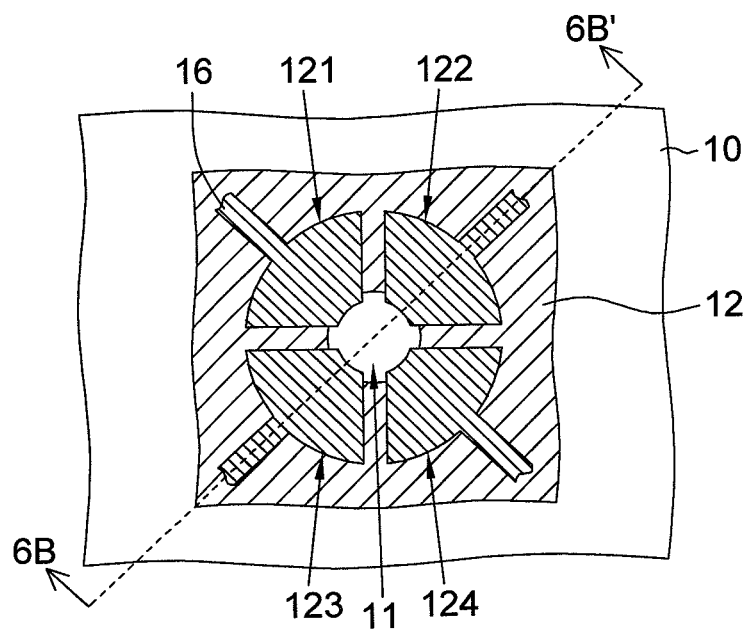
Figure 6B:
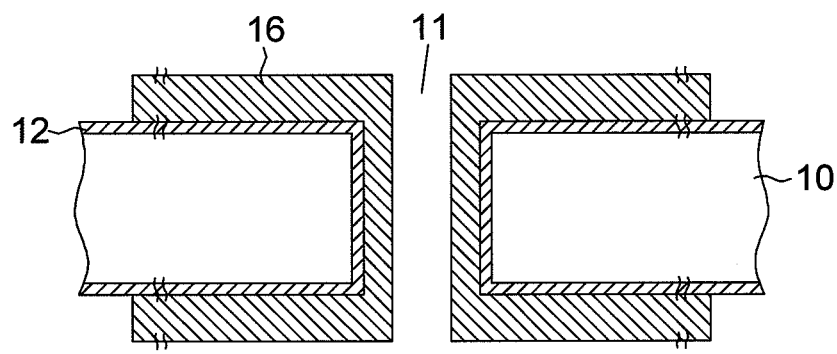

Next, the patterned photoresist layer 14' is removed, wherein the laterally separated regions 121~124 comprise a first conductive layer 12 covered by the second conductive layer 16, and the region outside the laterally separated regions 121~124 is covered by the first conductive layer 12 as indicated in FIG. 6A. FIG. 6B shows a cross-sectional view along the cross-sectional line 6B-6B of FIG. 6A.

Figure 7A:
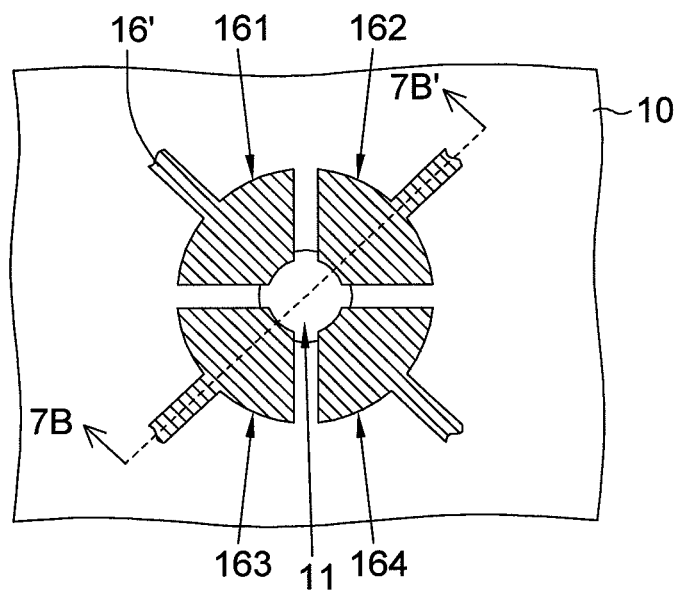
Figure 7B:
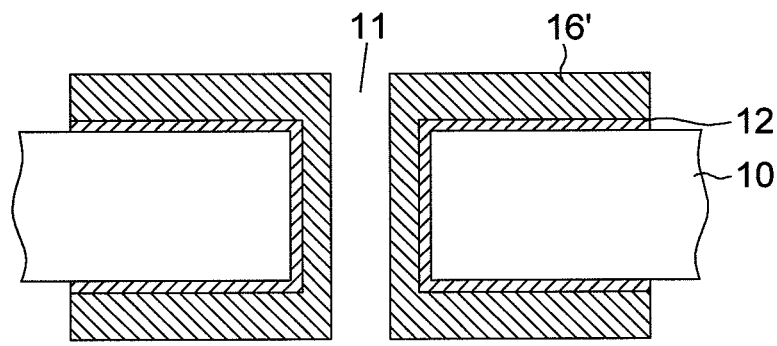
Figure 7C:
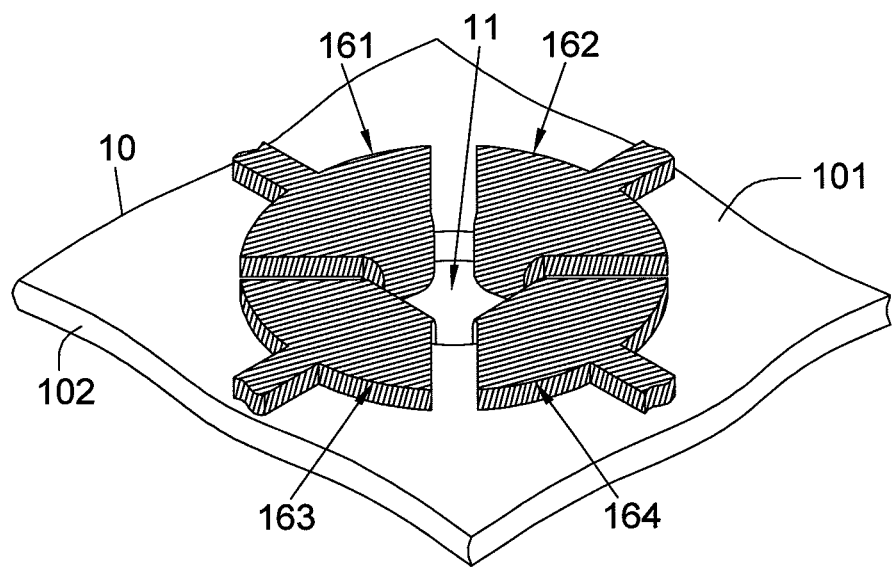

Then, the portion of the first conductive layer 12 not covered by the second conductive layer 16 is substantially removed by etching the first conductive layer 12 and the second conductive layer 16 to form a plurality of laterally separated traces 161, 162, 163, 164 as indicated in FIG. 7A. The laterally separated traces 161~164 are extended on the first surface 101 and through the hole 11. In the embodiment, the laterally separated traces 161~164 could also be extended to the second surface 102 through the hole 11. The portions of the laterally separated traces 161~164 in the hole 11 would be mutually extended in parallel, and perpendicular to the portions extended on the first surface 101. Also, the first conductive layer 12 disposed on the inner wall of the hole 11 and not covered by the second conductive layer 16 will also be removed. FIG. 7B shows a cross-sectional view along the cross-sectional line 7B-7B of FIG. 7A. As indicated in FIG. 7B, each of the laterally separated traces 161~164 comprises a patterned first conductive layer 12 and a patterned second conductive layer 16'. FIG. 7C shows a method of fabricating a multi-trace via substrate according to a first embodiment of the disclosure. As indicated in FIG. 7C, the laterally separated traces 161~164 are extended to the second surface 102 from the first surface 101 and through the hole 11, wherein the traces 161~164 in the hole 11 are mutually separated by a distance to avoid the occurrence of short-circuiting.

Second Embodiment

Referring to FIG. 8-FIG. 15B, the process of fabricating a multi-trace via substrate according to a second embodiment of the disclosure is depicted.

Similar to the beginning steps of the first embodiment, a substrate 10 having a first surface 101, a second surface 102 and a hole 11 is provided int the second embodiment, wherein the hole 11 has a hole wall 112, and both the first surface 101 and the hole wall 112 comprise an electrically insulating material. Next, a first conductive layer 12 is formed on the first surface 101 of the substrate 10 and the hole wall 112, and is further extended to the second surface 102 along the hole wall 112. The elements of the second embodiment similar to that of the first embodiment are already disclosed in FIG. 1 and FIG. 2, and are not redundantly described here.

Figure 8:
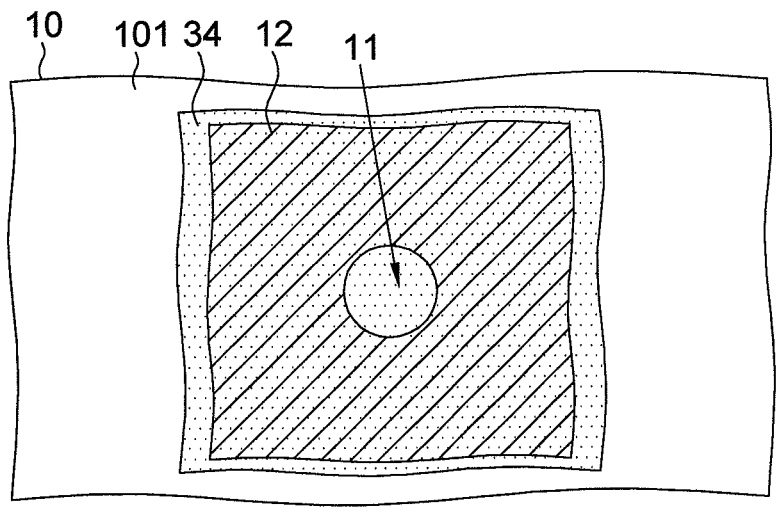
Figure 9A:
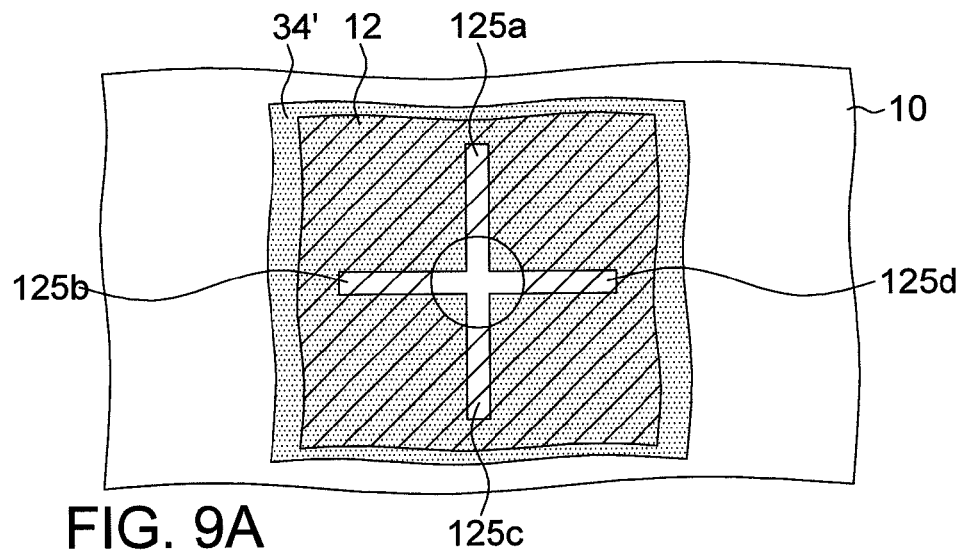
Figure 9B:
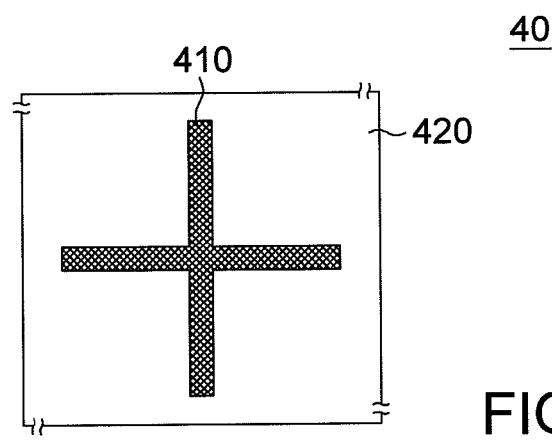
Figure 10:
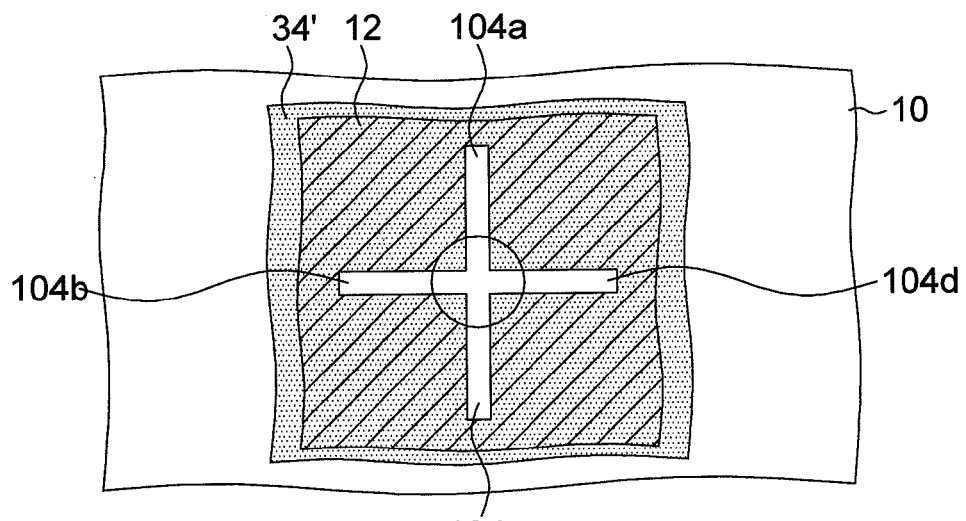

Then, the first conductive layer 12 inside and around the hole 11 is selectively patterned to define a plurality of insulating regions 104a~104d (as indicated in FIG. 10), wherein the insulating regions 104a~104d are formed by removing the first conductive layer 12, and each of the insulating regions 104a~104d is extended to the hole wall 112 from the first surface 101 of the substrate 10. Referring to FIG. 8, FIG. 9A and FIG. 9B, illustrate an implementation of defining the insulating regions 104a~104d.

As indicated in FIG. 8, a photoresist layer 34, applied over the entire surface of the first conductive layer 12, comprises at least one of a first surface 101 and a second surface 102, wherein the photoresist layer 34 also fills up the hole 11. Next, the mask 40 of FIG. 9B is provided for selectively patterning the photoresist layer 34 of FIG. 8. In this embodiment, the mask 40 has a non-transparent region 410 and a transparent region 420, and the non-transparent region 410 is cross-shaped. In the second embodiment, the photoresist layer 34 is made from a dry film photoresist. However, the photoresist layer 34 could also be made from a photoresist solution or other photo-sensitive materials. After exposure, the portion of the dry film photoresist corresponding to the transparent region 420 of the mask 40 is radiated by the light and forms a patterned photoresist layer 34' after polymerization. The portion of the dry film photoresist, which is not radiated by the light but corresponds to the non-transparent region 410 of the mask 40, is removed to form the regions 125a~125d on the first conductive layer 12. The polymerized dry film, which is formed after radiation of the light, corresponds to a portion of the transparent region 420 is temporarily disposed in the hole 11 for the time being. Thus, after the photoresist layer is selectively patterned, the first conductive layer 12 disposed on the regions 125a~125d (that is, disposed on the insulating regions 104a~104d of FIG. 10) is exposed outside the patterned photoresist layer 34' as indicated in FIG. 9A.

Then, the patterned photoresist layer 34' is used as a mask, and the first conductive layer 12 exposed on the regions 125a~125d of FIG. 9A is removed by etching so as to form four insulating regions 104a~104d of FIG. 10. Wherein, the insulating regions 104a~104d expose the surface (such as the first surface 101) of the substrate 10.

Figure 11:
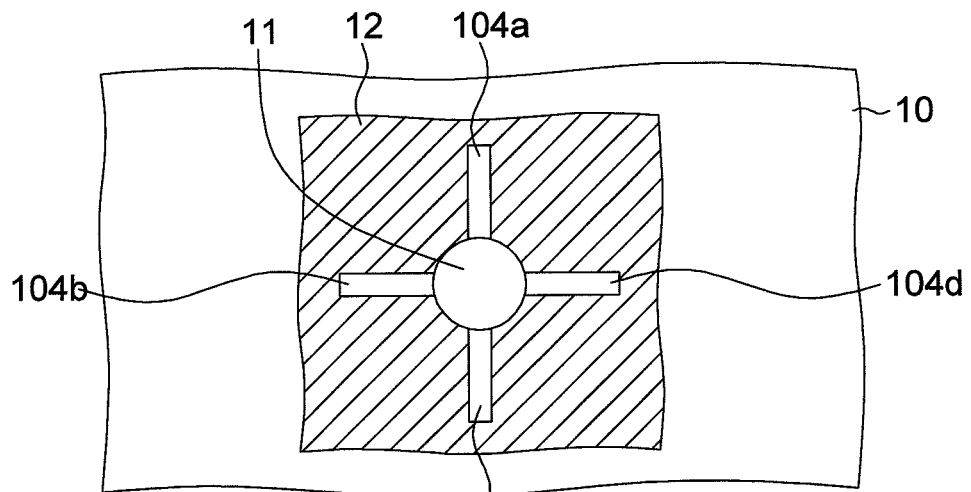

Next, the patterned photoresist layer 34' of FIG. 10 is removed to form a substrate 10 having insulating regions 104a~104d as indicated in FIG. 11. The fabricating method of the second embodiment is different from that of the first embodiment mainly in that traces the to be formed on the surface of the substrate 10 are separated by the insulating regions 104a~104d by photolithography method beforehand, and each of the insulating regions 104a~104d is extended to the hole wall 112 from the first surface 101 of the substrate 10.

Figure 12:
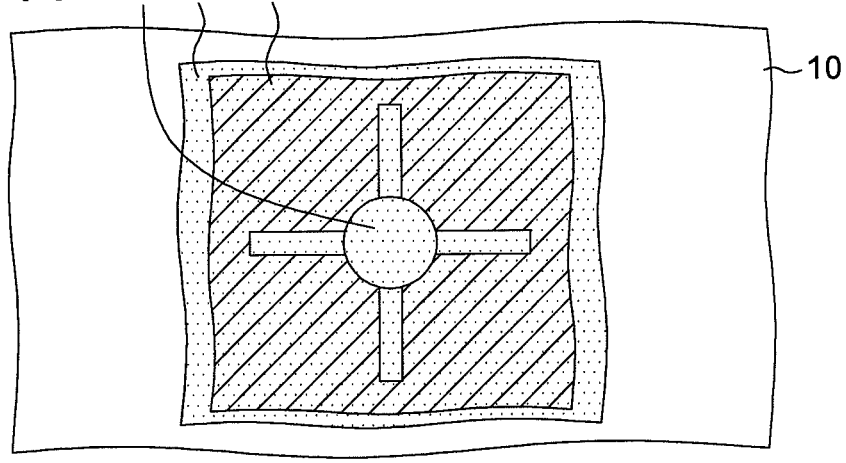

After providing the substrate 10 of FIG. 11 which has the insulating regions 104a~104d as indicated in FIG. 12, the entire surface of the first conductive layer 12 (such as the first surface) and the insulating regions 104a~104d are covered by a photoresist layer 54, which fills up the hole 11. The photoresist layer 54 could be made from a dry film photoresist, a photoresist solution or other photo-sensitive materials. In the present step, the material of the photoresist layer 54 is exemplified by a dry film photoresist, but the invention is not limited thereto.

Figure 13A:
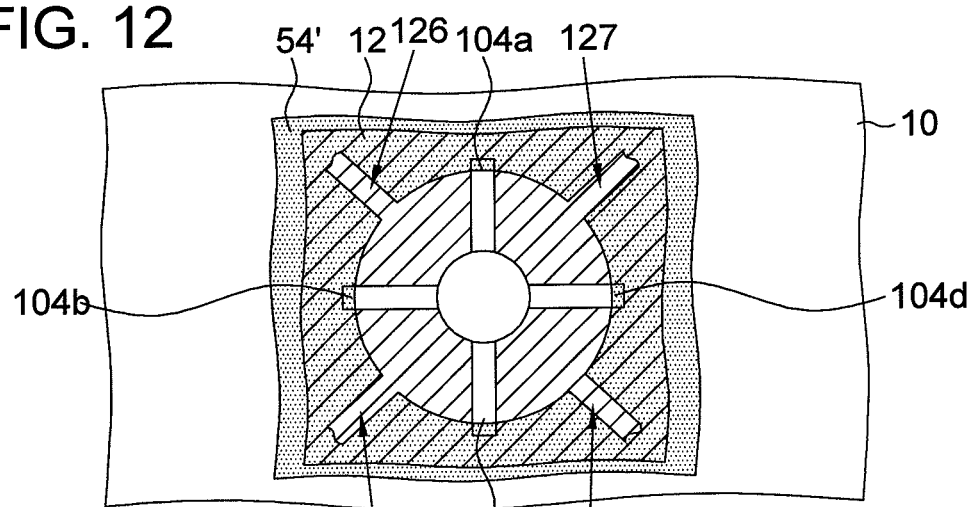
Figure 13B:
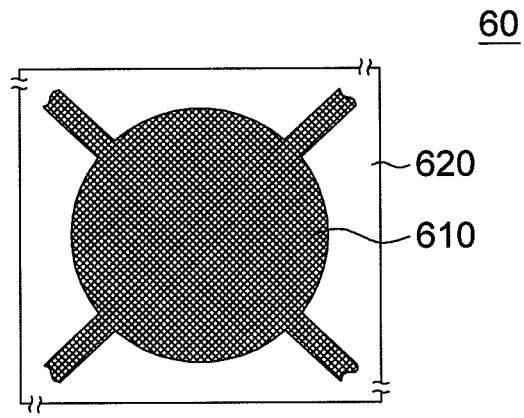
Figure 13C:
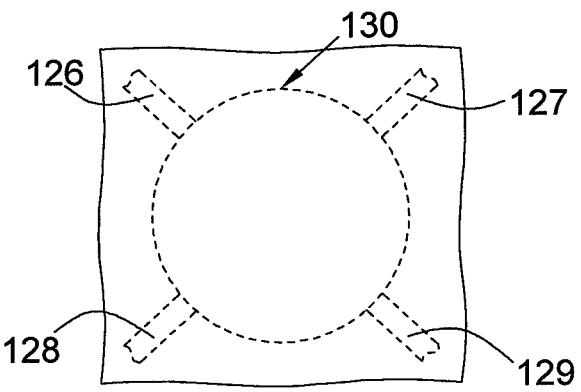

Next, the mask 60 of FIG. 13B is used for patterning the photoresist layer 54 of FIG. 12, and, after exposure is performed according to the locations and shapes of the transparent region 620 and the non-transparent region 610 on the mask 60, the portion of the dry film photoresist (the photoresist layer 54), which is radiated by the light, is remained thereon after polymerization, but the portion not radiated by the light is removed, and the pattern being formed is illustrated in FIG. 13A. Referring to both FIG. 13A and FIG. 13C. After the photoresist layer 54 is selectively patterned, four first regions 126~129 and a second region 130 (the dotted circle in FIG. 13C) are defined on the first conductive layer 12, wherein the second region 130 expose the insulating regions 104a~104d and is connected to at least two of the first regions (126~129). In the present embodiment, the second region 130 exposes a portion of the insulating regions 104a~104d, and the patterned photoresist layer 54' covers the region outside the first regions 126~129 and the second region 130 as indicated in FIG. 13A.

Then, the patterned photoresist layer 54' is used as a mask, a second conductive layer 56 is electroplated on the region outside the insulating regions 104a~104d disposed on the first regions 126~129 and the second region 130, wherein the second conductive layer 56 is substantially thicker than the first conductive layer 12. During the electroplating process, the second conductive layer 56 is formed on the portion of the first conductive layer 12 not covered by the patterned photoresist layer 54' (as indicated in FIG. 13A). The second conductive layer 56 being formed is extended to the second surface 102 from the first surface 101 through the hole 11.

Figure 14:
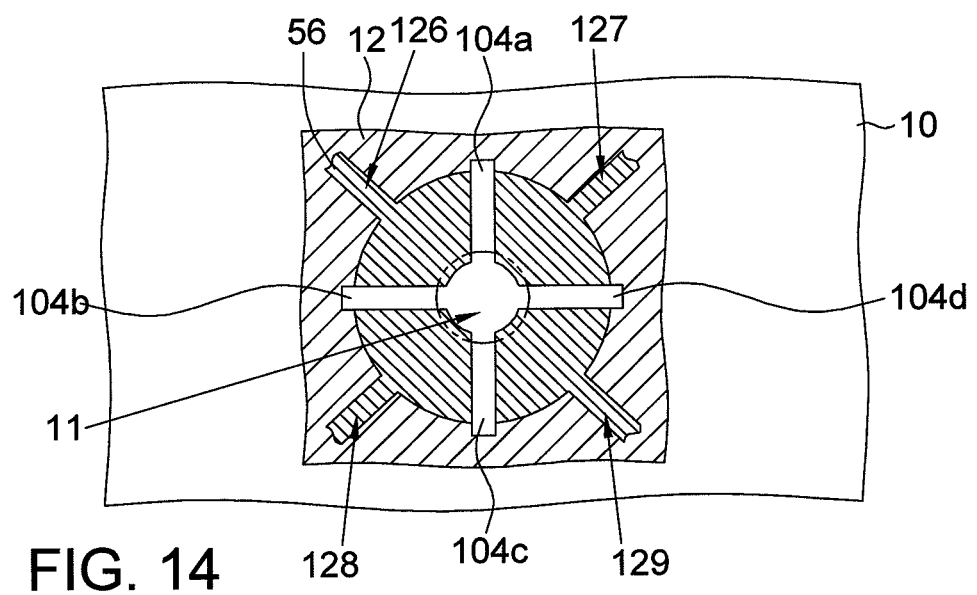

Next, the patterned photoresist layer 54' is removed. Meanwhile, the region outside the insulating regions 104a~104d on the first regions 126~129 and the second regions 130 comprise a first conductive layer 12, and a second conductive layer 56, wherein the second conductive layer 56 covers the first conductive layer 12. The insulating regions 104a~104d expose the substrate 10, and the region outside the hole 11, the first regions 126~129, and the second regions 130 covers the first conductive layer 12 as indicated in FIG. 14.

Figure 15A:
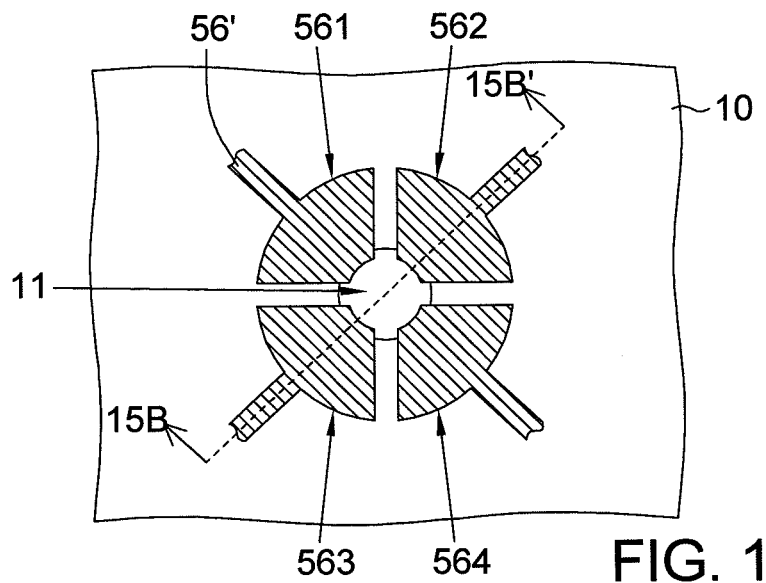
Figure 15B:
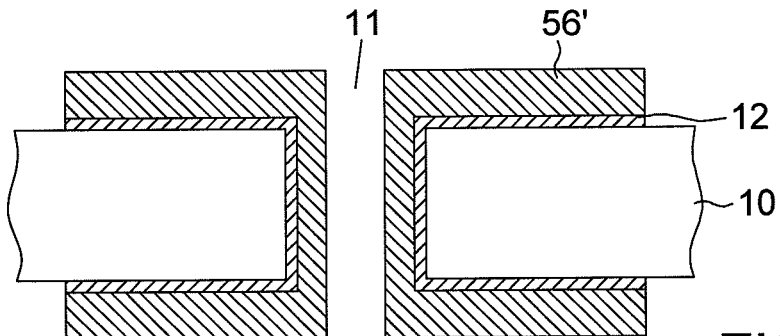

Then, the portion of the first conductive layer 12 not covered by the second conductive layer 56 is substantially removed by etching the first conductive layer 12 and the second conductive layer 56 to form four laterally separated traces 561, 562, 563, 564 as indicated in FIG. 15A. In the embodiment, the laterally separated traces 561~564 are extended on the first surface 101 and through the hole 11. FIG. 15B is a cross-sectional view along the cross-sectional line 15B~15B of FIG. 15A. As indicated in FIG. 15B, like the first embodiment, each of the laterally separated traces 561~564 of the second embodiment also comprises the first conductive layer 12 and an etched second conductive layer 56'. The laterally separated traces 561~564 are also extended to the second surface 102 from the first surface 101 and through the hole 11, and the traces 561~564 are mutually separated by a distance to avoid the occurrence of short-circuiting.

Figure 16:
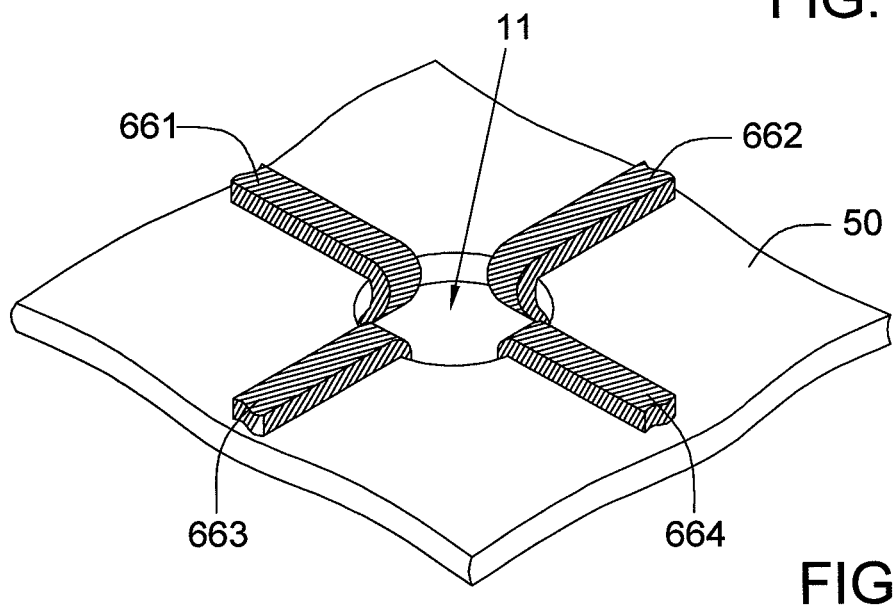
FIG. 16 shows the process of forming a plurality of landless traces on the substrate according to the embodiment of the disclosure.

Despite the drawings of the above embodiments are illustrated by the traces with land, the landless traces 661~664 as illustrated in FIG. 16 could be formed on the substrate 50, depending on the requirements of the applications. In practical applications, the pattern designs of the traces including the shape, the location and the number can be adjusted or modified according to actual needs. Thus, the mask disclosed in the above embodiments is merely an exemplification, not for limiting the invention.

Figure 17:
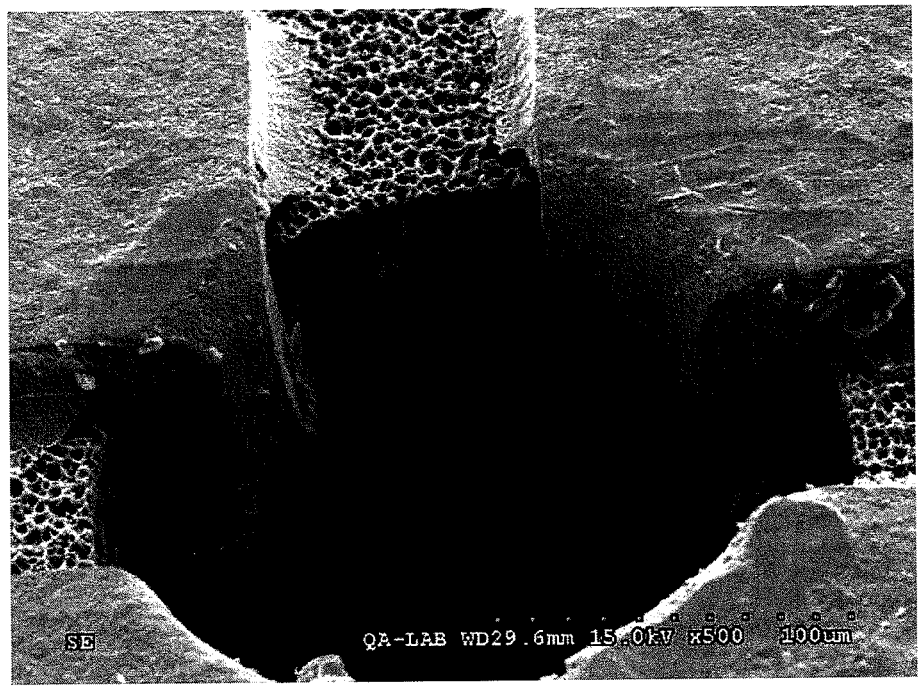
FIGS. 17 and 18 respectively show an electron microscope photo of the separated traces and the via formed according to the embodiment of the disclosure.
Figure 18:
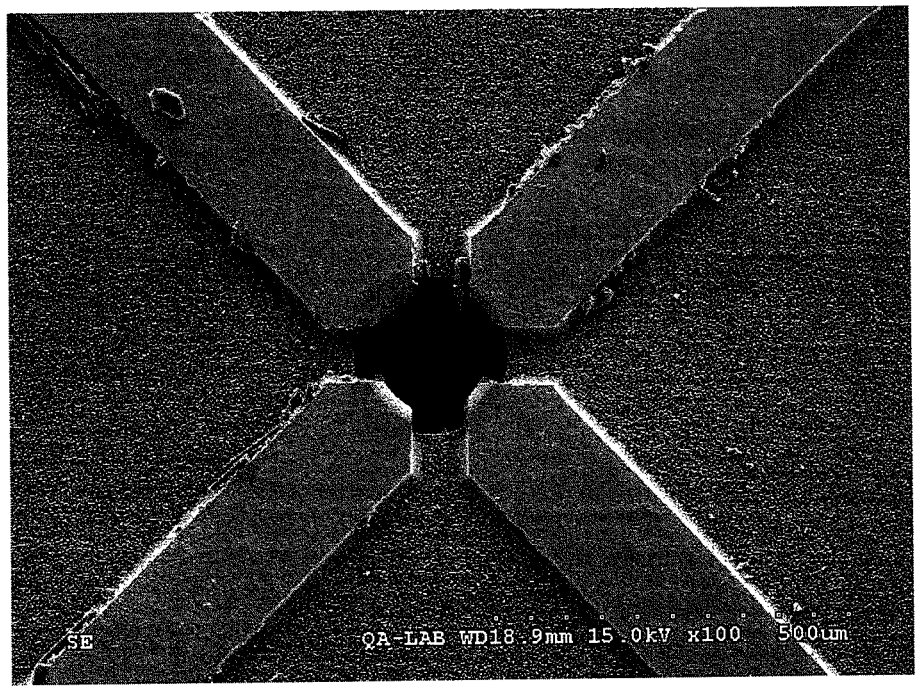

According to the method of fabricating a multi-trace via substrate disclosed in the above embodiments of the disclosure, it is found by an electronic microscope that laterally separated traces (such as the traces 161~164 of the first embodiment and the traces 561~564 of the second embodiment) have even edges, and the electrically insulating material exposed on the surface of the substrate is intact (referring to FIGS. 17 and 18, a photo of the separated traces and a photo of the via formed according to the embodiment of the disclosure, wherein the photos are taken by an electronic microscope). Compared with the convention process which employs laser cutting, the method disclosed in the embodiments of the disclosure quickly and accurately fabricating the multi-trace via substrate according to actual needs, has complete structure without damage for each layer, and increases yield rate.

While the disclosure has been described by way of example and in terms of a preferred embodiment, it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of fabricating a multi-trace via substrate, comprising:
   providing a substrate at least having a first surface and a hole, wherein the hole has a hole wall;
   forming a first conductive layer on the entire surface of the substrate and the hole wall;
   applying a photoresist layer over the entire surface of the first conductive layer, and selectively patterning photoresist layer so as to define a plurality of laterally separated regions on the first conductive layer extended from the first surface to the hole wall;
   using the patterned photoresist layer as a mask and electroplating a second conductive layer substantially thicker than the first conductive layer on the laterally separated regions;
   removing the patterned photoresist layer; and
   substantially removing the portion of the first conductive layer not covered by the second conductive layer to form a plurality of laterally separated traces extended on the first surface and through the hole.

2. The method of fabricating the multi-trace via substrate according to claim 1, wherein the substrate has a second surface opposite to the first surface, the hole is extended between the first surface and the second surface, the first conductive layer further covers the second surface of the substrate, and the laterally separated regions are extended to the second surface from the first surface through the hole.

3. The method of fabricating the multi-trace via substrate according to claim 2, wherein the step of selectively patterning the photoresist layer further comprises forming a photoresist barrier portion in the hole to define a plurality of isolated spaces therein, and the laterally separated regions are respectively extended to the second surface from the first surface through the isolated spaces in the hole.

4. The method of fabricating the multi-trace via substrate according to claim 3, wherein after the second conductive layer is electroplated on the laterally separated regions, the second conductive layer is extended to the second surface from the first surface through the isolated spaces in the hole.

5. The method of fabricating the multi-trace via substrate according to claim 3, wherein the photoresist barrier portion in the hole substantially has a cross-shaped cross section.

6. The method of fabricating the multi-trace via substrate according to claim 1, wherein the laterally separated traces are extended to the second surface from the first surface and through the hole.

7. The method of fabricating the multi-trace via substrate according to claim 1, wherein the step of forming photoresist layer comprises pressing a dry film photoresist on the substrate so that the photoresist fills up the hole.

8. The method of fabricating the multi-trace via substrate according to claim 1, wherein the step of forming photoresist layer comprises spreading a photoresist solution on the substrate so that the photoresist fills up the hole, and drying the photoresist solution to form the photoresist layer.

9. The method of fabricating the multi-trace via substrate according to claim 1, wherein the laterally separated traces within the hole are spaced apart and electrically isolated from each other.

10. The method of fabricating the multi-trace via substrate according to claim 1, wherein each laterally separated trace on the first surface and within the hole includes a patterned second conductive layer laminated on a patterned first conductive layer.

11. A method of fabricating a multi-trace via substrate, comprising:
    providing a substrate having a first surface and a hole, wherein the hole has a hole wall;
    forming a first conductive layer on the first surface of the substrate and the hole wall;
    selectively patterning the first conductive layer inside and around the hole to define a plurality of insulating regions, wherein the insulating regions are formed by removing the first conductive layer, and each insulating region is extended to the hole wall from the first surface of the substrate;
    applying a photoresist layer over the entire surface of the first conductive layer and the insulating regions, and selectively patterning the photoresist layer to define a plurality of first regions on the first conductive layer and expose a second region of the insulating regions, wherein at least two first regions are connected to the second region;
    using the patterned photoresist layer as a mask and electroplating a second conductive layer on the first regions and the portion outside the insulating region on the second region, wherein the second conductive layer is substantially thicker than the first conductive layer;
    removing the patterned photoresist layer; and substantially removing the portion of the first conductive layer not covered by the second conductive layer to form a plurality of laterally separated traces, wherein the laterally separated traces are extended on the first surface and through the hole.

12. The method of fabricating the multi-trace via substrate according to claim 11, wherein the step of electively patterning the first conductive layer comprises:

applying a photoresist layer over the entire surface of the first conductive layer, and selectively patterning the photoresist layer so that the first conductive layer on the insulating regions is exposed on the patterned photoresist layer; and using the patterned photoresist layer as a mask and removing the first conductive layer exposed outside the patterned photoresist layer by etching to form the insulating regions.

13. The method of fabricating the multi-trace via substrate according to claim 12, wherein after removing the first conductive layer exposed outside the patterned photoresist layer, the patterned photoresist layer is then removed.

14. The method of fabricating the multi-trace via substrate according to claim 11, wherein after step of selectively patterning the photoresist layer is performed, the first regions and the second region are formed, and the hole of the substrate is exposed.

15. The method of fabricating the multi-trace via substrate according to claim 11, wherein the substrate has a second surface opposite to the first surface, the hole is extended between the first surface and the second surface, the first conductive layer further covers the second surface of the substrate.

16. The method of fabricating the multi-trace via substrate according to claim 15, wherein after the first conductive layer is patterned, the insulating regions being defined expose the first surface of the substrate, and the insulating regions are extended to the second surface from the first surface through the hole.

17. The method of fabricating the multi-trace via substrate according to claim 15, wherein the laterally separated traces extended on the first surface are further extended to the second surface through the hole.

18. The method of fabricating the multi-trace via substrate according to claim 11, wherein the laterally separated traces within the hole are spaced apart and electrically isolated from each other.

19. The method of fabricating the multi-trace via substrate according to claim 11, wherein each laterally separated trace on the first surface and within the hole includes a patterned second conductive layer laminated on a patterned first conductive layer.

* * * * *